United States Patent
Izu et al.

[11] Patent Number: 6,028,393
[45] Date of Patent: Feb. 22, 2000

[54] E-BEAM/MICROWAVE GAS JET PECVD METHOD AND APPARATUS FOR DEPOSITING AND/OR SURFACE MODIFICATION OF THIN FILM MATERIALS

[75] Inventors: Masatsugu Izu, Bloomfield Hills; Joachim Doehler, Union Lake; Scott Jones, Clinton Township, Macomb County, all of Mich.

[73] Assignee: Energy Conversion Devices, Inc., Troy, Mich.

[21] Appl. No.: 09/010,648

[22] Filed: Jan. 22, 1998

[51] Int. Cl.$^7$ ........................................ H01J 7/24
[52] U.S. Cl. .......................... 315/111.01; 315/111.21; 315/111.81; 118/723 EB; 118/723 MW
[58] Field of Search .................. 315/111.01, 111.21, 315/111.81, 111.51; 118/723 FE, 723 MW, 723 ME, 723 DC, 723 ER, 723 IR, 723 EB

[56] References Cited

U.S. PATENT DOCUMENTS

| | | |
|---|---|---|
| 4,645,977 | 2/1987 | Kurokawa et al. ............... 315/111.21 |
| 4,684,848 | 8/1987 | Kaufman et al. ................ 315/111.81 |
| 4,883,686 | 11/1989 | Doehler et al. ..................... 427/562 |
| 5,093,149 | 3/1992 | Doehler et al. ..................... 427/563 |
| 5,256,205 | 10/1993 | Schmitt, III et al. .......... 118/723 MW |
| 5,637,962 | 6/1997 | Prono et al. ..................... 315/111.21 |

Primary Examiner—Haissa Philogene
Attorney, Agent, or Firm—David W. Schumaker; Marvin S. Siskind; Philip H. Schlazer

[57] ABSTRACT

A novel high speed, high quality plasma enhanced surface modification or CVD thin-film deposition method and apparatus. The invention employs both microwave and e-beam energy for creation of a plasma of excited species which modify the surface of substrates or are deposited onto substrates to form the desired thin film. The invention also employs a gas jet system to introduce the reacting species to the plasma. This gas jet system allows for higher deposition speed than conventional PECVD processes while maintaining the desired high quality of the deposited materials.

21 Claims, 2 Drawing Sheets

E-BEAM/MICROWAVE GAS JET PECVD METHOD AND APPARATUS FOR DEPOSITING AND/OR SURFACE MODIFICATION OF THIN FILM MATERIALS

FIELD OF THE INVENTION

The instant invention relates generally to PECVD thin film deposition/surface modification methods and apparatus therefor, and more specifically to gas jet PECVD deposition of thin films. Specifically, the instant invention relates to a combined e-beam/microwave gas jet PECVD method and apparatus for deposition/surface modification of thin film materials.

BACKGROUND OF THE INVENTION

Thin film deposition techniques, such as plasma enhanced chemical vapor deposition (PECVD), and apparatus therefore have been around for a number of years. They are useful in the production of many products.

One such use is in deposition of hard coatings. Since its inception, there has been a demand for hard thin film coatings for use in the cutting tool, ball bearing and military armor industries. In the high tech world in which we live today, the demands for these type of films are even greater with applications covering a vast number of unconventional fields. For example, there is a need in the computer field for protective coatings for magnetic tape heads and hard CD disks. Also the ever growing telecommunications field requires hard films to protect optical fibers. Recently, there has been a large demand from the medical industry for use of hard thin coatings for such applications as orthopedic devices and wear resistant teeth. With the large number of applications for these types of films, improvements in the wear properties of these thin film coatings can drastically increase the lifetimes of many of the above mentioned products saving billions of dollars. Thus while there have been many advances in the hard thin film coating field over the past few decades, there is always a demand for further improvement of the tribological properties of these materials.

The use of low energy bombardment during the growth of these types of films has been found to have a strong affect on the wear properties of resulting film. In particular, the microhardness of diamond-like coating has been found to substantially increase with an increase in flux density of the ions bombarding the film surface during growth. Similar improvements in the tribological properties of boron nitride, titanium nitride, tungsten and copper with increased ion bombardment have been reported. However, to obtain these high flux conditions using standard chemical vapor deposition processes, one must use high applied powers and high chamber pressures which lead to undesirable film properties. In the case of diamond-like carbon films, gas phase polymerization occurs under these conditions leading to the formation of graphitic-like structures in the films leading to poor tribological properties. For boron nitride films, detrimental hydrogenated and amorphous phases appear in the films under these conditions. In addition, the ion energies in these processes under the high power conditions are unacceptably high, leading to sputtering, point defect or defect cluster formation and other undesirable effects. As an alternative, conventional ion beam sources have been used in conjunction with film deposition processes to produce the desired ion fluxes and bombarding conditions. However, the surface area coverage of these types of ion sources are limited and the sources themselves can be somewhat costly.

Because there is such a broad base of interest in wear resistant thin films, the benefits of improved tribological properties for these films or advances in the process used to prepare them with would be far reaching. Improvements in the computer, telecommunications and medical products listed previously are obvious. Mass-produced goods, such as micro-machined sensors and actuators, cutting and machining tools and even ordinary ball bearings, whose performance depends upon the characteristics of a protective thin-film coating, could be improved. In addition, for films that can be made to be transparent, the improved coating could be applied to increase the protection of already-hard glass or ceramics used for demanding applications such as airplane windshields and canopies. A new process producing superior quality films could also affect fields besides those interested in only wear resistance. For example, the making of diamond films, which are used as part of heat sinks for semiconductor devices and PC boards because of their high thermal conductivities and strong insulating properties, could benefit from a new technique as well.

Thus, the economic impact to a country whose industry depends on leading-edge production technologies is enormous. A specific agency in the federal government, which could strongly benefit from this improved technology, is the Department of Defense, through the acquisition of otherwise fragile sensors that must survive the rigors of the field.

Another useful area for thin film deposition is photovoltaics. Photovoltaics (PV), the direct conversion of sunlight into electricity, has long been a principal source of electrical energy for use in space applications. It's practical use on earth has traditionally been limited to only small area applications with large scale use being too costly. However, a growing awareness of and concern over the environmental consequences of conventional fossil-fuel and nuclear power and the desire to reduce reliance on imported oil have increased the need for practical, affordable renewable energy. In PV research and development, much of the focus has been on thin film solar cell technology because of the potential of preparing large area modules at low temperatures at reduced material costs over the standard crystalline silicon modules. Amorphous Silicon (a-Si:H) technology stands out in the thin film field due to the relatively simple, inexpensive deposition process used to produce solar modules, the environmentally safe materials in the final product and the ability to use light-weight, flexible substrates to create the modules.

While many advancements in a-Si:H PV technology have been made by Energy Conversion Devices, Inc. of Troy Michigan (ECD) and other research groups, the highest present day stable efficiencies for small area (0.25 $cm^2$) triple-junction cells are around 13% and 10% efficiencies have been obtained for 4 $ft^2$ modules. In order to improve these efficiencies and the performance of other a-Si:H based devices (thin film transistors, photosensors, etc.), several issues related to the a-Si:H material and its alloys must be addressed:

1) Low Carrier Mobilities and Poorer Carrier Collection

The carrier mobilities of a-Si:H are rather low compared with those for crystalline materials. For device quality material, the electron mobilities are between 0.5 to 1.5 $cm^2Vs$, more than two orders of magnitude lower than crystalline Si, and these low values limit the use of a-Si:H particularly in thin film transistors. The hole mobilities for these materials, which dictate the solar cell properties, are even lower than the electron mobilities. These lower mobilities have been attributed to the existence of localized "tail states" in the amorphous materials. By crystallizing a-Si:H materials through techniques such as laser annealing, mobilities as high as 100–400 cm$^2$Vs have been obtained. However, being able to obtain higher mobilities without having to use post-deposition processing would be desirable and cost efficient.

These a-Si:H based materials also have relatively large numbers of defects as compared with crystalline materials which hinder carrier collection. Over several years of optimization of the deposition conditions of the PECVD process, the defect density levels for the best materials have been decreased to $10^{15-10^{16}}$ cm$^{-3}$. If these levels are further reduced, improvements should be seen in the solar cell as well as other a-Si:H based device properties.

Obviously, improvement in the electronic quality of a-Si:H based materials, in terms of higher carrier mobilities, lower densities of defects and better carrier collection in devices, would advance the use of a-Si:H technology dramatically.

2) Poor Quality Low Bandgap Materials

In order to alter its bandgap, a-Si:H is typically alloyed with various materials as is done of crystalline materials. However, the carrier collection generally degrades when a-Si:H is alloyed with other elements. In respect to the photovoltaics field, a-Si:H is typically alloyed with Ge to lower the bandgap to collect a greater segment of the red part of the solar spectrum. For a-SiGe:H alloys with Ge contents greater than 20%, the photoconductivities and solar cell properties are poorer than those for a-Si:H, with the degradation in properties attributed to a number of factors including the presence of weak germanium-hydrogen bonds, the formation of Ge clusters, the formation of dangling bonds and the emergence of a low density microstructural phase. Improvement in the quality of the amorphous silicon-germanium alloy (a-SiGe:H) material could lead to a significant improvement in the triple-junction solar cells and red light sensors. Several attempts have been made to improve the properties of a-SiGe:H layers and cells through variations in the PECVD deposition conditions. Some progress has been made with higher quality materials prepared at high substrate temperatures, using a substantial amount of hydrogen dilution and under a moderate amount of ion bombardment. However, the optoelectronic and solar cell properties for the a-Si:H alloy are still far superior to those for the a-SiGe:H alloy.

There has been a growing interest in microcrystalline silicon materials as an alternative to a-SiGe:H as low bandgap layers in the multijunction solar cell structure. In particular, a Very High Frequency (VHF) technique has recently been used to prepare novel microcrystalline silicon materials for i-layers in single junction and multi-junction solar cell structures. An important characteristic which makes this microcrystalline material an attractive alternative is that while the material has similar photoconductive properties to the initial properties for the amorphous alloy, these properties do not degrade with prolonged light exposure (>1000 hrs.) as they do for the amorphous material. This degree of stability has been demonstrated in single junction cells whose i-layers were microcrystalline while the n and p-layers were amorphous. These cells had 7.7% efficiencies which did not change after 1000 hrs. of light soaking. Combining this type of cell with a thin a-Si:H blue light absorbing top cell to form a multi-junction cell, efficiencies of 13.1% have been obtained in one attempt to prepare this multi-junction structure. A larger effort to optimize the cell structure involving a number of different laboratories should lead to even higher efficiencies.

While these results are encouraging, there are limitations to the VHF method presently used to prepare the microcrystalline i-layers for the solar cells. The light absorption efficiency for microcrystalline silicon as compared with a-Si:H and a-SiGe:H is low requiring the microcrystalline silicon i-layer thickness to be 10 times thicker than that for the standard a-SiGe:H red light absorbing layers. With the VHF method, the high quality microcrystalline silicon is restricted to a deposition rate around 1 Å/s. To use this technique for the production of large area panels using a roll-to-roll machine, the web substrate would have to move 10 times slower through the machine or the machine would have to be roughly 10 times larger than the present day machines. For a batch reactor, the process time would have to be ten times longer. All of these options are economically impractical. Also, the present 13% efficiency is limited in most part by a rather low open circuit voltage ($V_{oc}$) due to the low band gap of the microcrystalline silicon. Increasing this bandgap through alloying with another element like carbon should lead to a significant improvement in the device performance. However, preparation of a high quality microcrystalline silicon carbon material has not yet been done using standard PECVD or VHF deposition techniques. Thus, there is a demand for a deposition technique which can be used to produce microcrystalline material with a larger bandgap than the present microcrystalline silicon material at deposition rates of 10 Å/s or higher.

As another alternative, thin polycrystalline silicon thin films have been used as the red light absorbing layers in the multi-junction solar cell structure. Stable efficiencies of 11.5% have thus far been obtained. However, use of the polycrystalline material is again hindered by the lack of a high rate deposition technique.

3) Light Degradation of Electronic/Carrier Properties

When high quality a-Si:H materials in devices are subjected to sunlight, the material becomes more defective and the device properties degrade. For example, when the material is incorporated into either an nip or pin solar cell design, this degradation is seen in the form of decreased fill factors, open circuit voltages and cell efficiencies as the cells are subjected to light. Many research groups, including ECD's, have made several efforts to minimize the amount of degradation through alterations in the deposition conditions used in the standard PECVD deposition process. Some advances have been made including the use of hydrogen dilution in the gas plasma to lessen the extent of device degradation. United Solar Systems Corporation of Troy, Mich. has recently shown that for a single-junction a-Si:H nip device, the amount of degradation of the device properties can be reduced by a factor of two through strong hydrogen dilution of the gas plasma during i-layer growth. However even with these improvements, the device properties still degrade by 10–15% from their initial pre-light soaked values.

In the thin film transistor industry, these material instabilities limit the lifetime of the displays to several thousand hours of operation at best. Thus, substantial gains in terms of device efficiencies would be obtained if a-Si:H alloy materials were made to be less susceptible to light soaking.

Attempts to improve the material properties have included a large variation of the deposition conditions used in the PECVD process. However, the gains from recent studies have been rather small and the progress slow moving. In order to solve these deficiencies in the a-Si:H technology, several studies of a-Si:H materials prepared using alternative deposition techniques to the PECVD method have been made. The variety of deposition techniques include electron cyclotron resonance, remote RF plasma and hot wire deposition methods. In most cases the properties for the materials and/or the solar cells have yet to be proven to show properties better than those for PECVD. Besides the material quality, the PECVD technique is easily applied to large scale depositions with relatively uniform depositions obtainable over many square feet. For many of these alternative deposition methods, scaling from the small R&D scale to the large module production level is not straight forward or even possible to meet the demands of uniform large area deposits.

In lieu of an alternative deposition technique for a-Si:H, there is a growing recognition in the PV community that in order to obtain the desired higher stable efficiencies, an alternative thin film PV material must be developed to replace a-Si:H as well as other thin film PV materials (CuInSe$_2$, CdTe, thin film Poly Si, etc.). This material must have many of the advantageous properties of a-Si:H (low temperature preparation, flexible substrate, simple deposition process, large area deposition capability, etc.) while having the higher stable efficiencies. With these higher efficiencies, a significant reduction in the cost of PV products and technology would be realized which would enable PV to play a major role in improving the quality, cost effectiveness and sustainability of the U.S. energy supply. The improved solar modules will also provide important export opportunities to supply power to the two billion people around the world that lack electricity while maintaining a clean environment. The major barrier to wide scale commercialization of PV to date has been its relatively high cost, and reducing the cost of PV modules is the major challenge confronting the industry. Other, more mature PV technologies, such as crystalline silicon, have reached a plateau, and further substantial price reductions are unlikely. It is generally agreed that a-Si:H or some other comparable thin film technology will be the technology most likely to break significant price barriers and lead to accelerated PV industry growth. U.S. domination of this technology is, therefore, critical to U.S. leadership in a multi-billion dollar market.

Development of this alternative material will also have an impact on several other a-Si:H technologies besides PV which are limited by the properties of a-Si:H, including thin film transistors, linear image arrays and other particle detectors.

To develop these and other materials, a new, fast method of depositing thin film materials is needed. Preferably the new method will deposit the materials at high speed and the deposited materials will be of high quality. The method will also preferably be a PECVD method employing microwaves and controlled ion bombardment of the growing film.

SUMMARY OF THE INVENTION

Disclosed herein is a plasma jet surface modification or thin film deposition apparatus and method. The apparatus includes an evacuable deposition chamber into which a substrate is disposed. A source of transonic feedstock gas is introduced into the chamber which is then impinged by e-beam energy and microwaves creating a high velocity plasma of activated species. The high velocity plasma forms a plume which is directed towards the substrate and the activated species modify the surface of or deposit onto the substrate. The source of transonic velocity feedstock gas includes a gas delivery system and a gas jet nozzle which is positioned within the chamber. Preferably the gas jet nozzle is rotatable, thereby allowing the direction of travel of the activated species within the high velocity plasma to be varied.

The substrate can be a moving elongated web of substrate material which passes into and out of the evacuable deposition chamber or individual fixed substrates. The substrate can be formed from stainless steel or a polymer material and may be heated and/or electrically biased.

The feedstock gas provides materials which are created into surface modifying or depositing species within the plasma. Optionally the feedstock gas provides non-depositing species within said plasma also. The feedstock gas may be reactive with other species in said plasma or non-reactive.

The e-beam energy is typically around 15 KeV and typically has a power of about 1000–5000 Watts. The microwave energy typically has a frequency of about 2.45 GHz at a typical power of about 500–5000 Watts.

The apparatus may also include a second source of gas which can be non-transonic. The second source of gas can be introduced into the evacuable chamber adjacent the plasma created by the source of transonic velocity feedstock gas. The apparatus may also include a second source of microwave energy which creates a second plasma from said second source of gas. This second plasma can be used to modify the thin film surface properties through such processes as enhanced etching and ion bombardment. The apparatus may also further include a magnetic field between the high velocity plasma and the substrate to separate different species from the plasma plume.

DETAILED DESCRIPTION OF THE INVENTION

This instant invention is a novel high speed, high quality plasma enhanced surface modification or CVD deposition method and apparatus. The invention employs both microwave and e-beam energy for creation of a plasma of excited species which modify the surface of or are deposited onto substrates to form a thin film. The invention also employs a gas jet system to introduce the reacting species to the plasma. This gas jet system allows for higher deposition speed than conventional PECVD processes while maintaining the desired high quality of the deposited materials.

The inventive method utilizes a supersonic gas jet plasma excited by the combination of an electron beam and a microwave source. This dual excitation technique produces a stable, highly energized plasma at relatively high pressure that can create an ion flux density much higher than those obtained from the present state-of-the-art methods used to prepare thin films. Also since the substrate is separated from the plasma, the energy of the bombarding ions can be independently controlled through electrical substrate biasing, thereby allowing for control over the surface structure and chemistry. Rigid control of the ion fluxes is also possible through the variation of the gas flow and excitation parameters. The ability to create a controllable high ion flux density also makes this technique ideal as a substrate etching technique with the proper selection of source gases.

The instant invention combines two thin film deposition processes independently developed by Polisan et. al. and Doehler et. al. In the technique developed by Polisan and his fellow Russian collaborators, a silicon source gas flow ($SiH_4$, $Si_2H_6$, etc) is forced at high speeds through a jet nozzle pointed at the heated substrate surface. Before reaching the substrate surface, the gas is subjected to an electron beam which produces a gas plasma and radicals which deposit on the substrate surface forming the thin film. Using this deposition method, Polisan et.al. have prepared a-Si material with photoconductivity to dark conductivity ratios greater than $10^5$ at a deposition rate of 20 Å/s. While this photoconductivity to dark conductivity ratio is similar to the ratios obtained for high quality PECVD deposited a-Si, the deposition rate for the gas jet films was a factor of ten higher than that for the PECVD films. The fact that high quality films can be prepared at high rates demonstrates that this technique is capable of generating a high flux of excited species, while causing minimum structural damage to the exposed surface.

The technique independently developed at ECD by Doehler and his colleagues differs only from the technique developed in Russia in that the gas is excited by microwaves rather than an electron beam. The key advantages to using the microwave excitation is the potentially large ion fluxes and high gas dissociation rates, both of which are obtainable.

Figure 1:
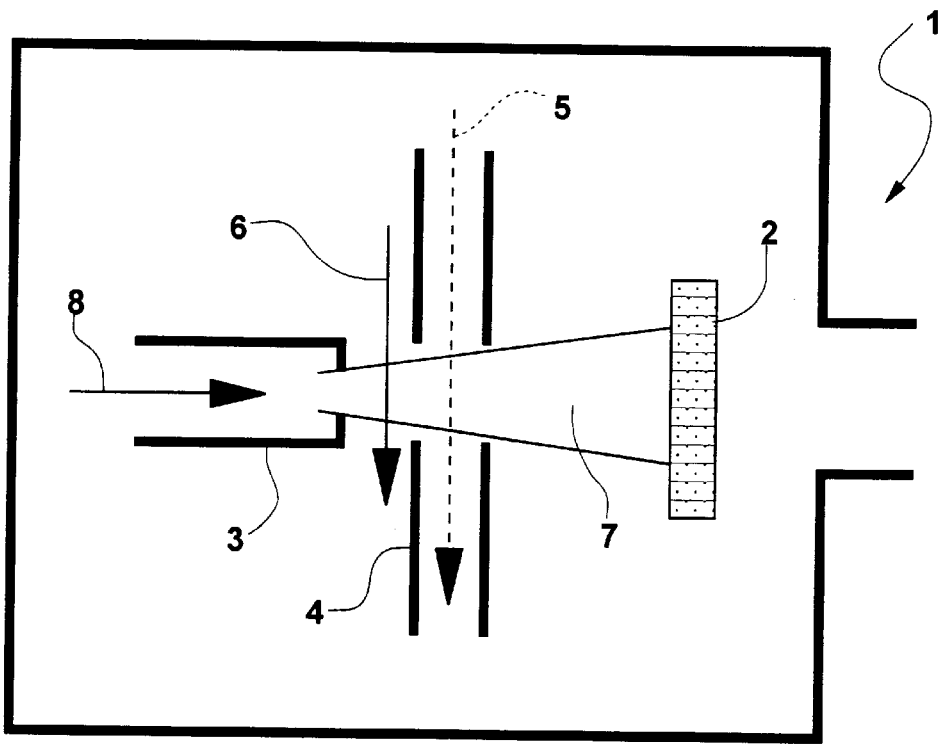
FIG. 1 is a stylized drawing depicting a first embodiment of the apparatus of the instant invention.

The gas jet plasma process/apparatus of the instant invention is shown in FIG. 1. The apparatus comprises an evacuable chamber 1, which can be evacuated to the desired operating pressure. A substrate 2 is placed within the chamber 1 upon which a thin film may be deposited or the substrate surface modified. The feedstock (reactive or nonreactive) and carrier gases (if any) 8 are introduced into the chamber 1 through a gas jet injection port 3. The feedstock gases 8 exit the injection port 3 at supersonic speeds. After exiting the gas jet injection port 3, an electron beam 6 strikes the gases, creating a plasma in the rapidly expanding feedstock gases 8. Once the gases have been ignited by the electron beam, they pass through a microwave cavity 4 through which microwaves 5 are flowing. The microwaves create an even higher energy and denser plasma. The plasma plume 7 expands and deposits a thin film on or modifies the surface of the substrate 2. The substrate 2 may be a moving web of substrate material or may be an individual discrete substrate.

Figure 2:
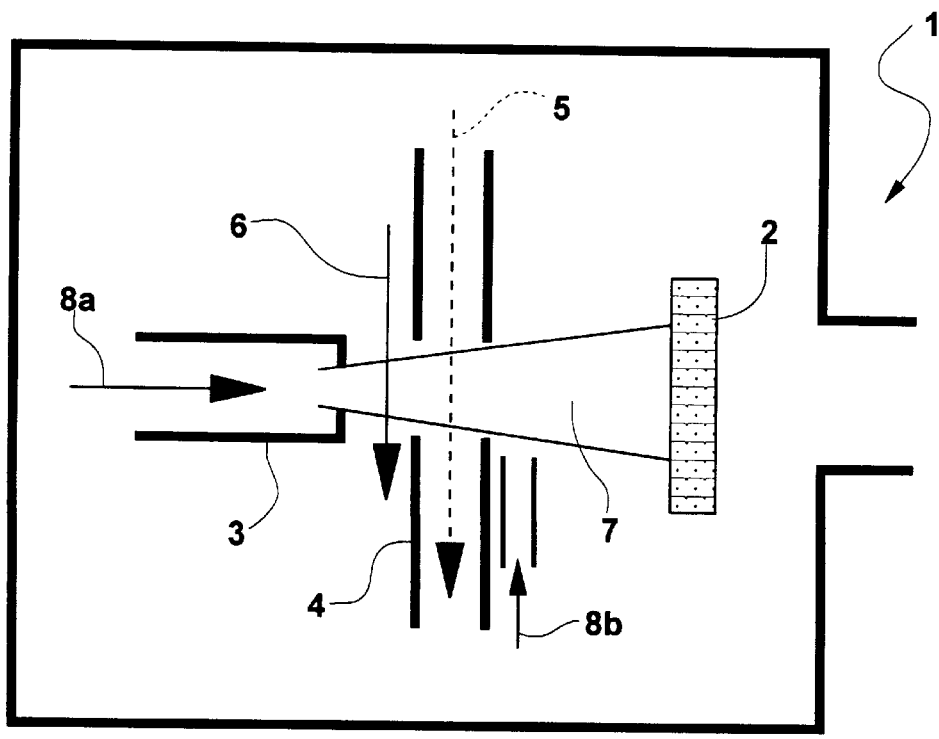
FIG. 2 is a stylized drawing depicting a second embodiment of the apparatus of the instant invention, and specifically shows a second source of gas.

In an alternative embodiment, shown in FIG. 2, a portion of the feedstock gases 8a are introduced through the gas jet 3, while additional gases 8b are introduced through a conventional gas inlet. The distance and positioning between the gas inlets and the substrate can be varied depending on the requirements of the deposition or etching. In all other respects the apparatus and process are the same as in FIG. 1.

In this process, the supersonic gas jet flow is first excited by an electron beam and then by a microwave cavity or simultaneously by both. In previous studies with microwave technique, it was found that the combination of the microwave excitation and the supersonic gas jet lead to a plasma which was not as stable as was desired. The role of the electron beam in the instant invention is to act as controllable excitation source to stabilize the plasma while the microwaves disassociate much of the gas creating a high ion flux.

As used herein, the term "surface modification" and variations thereof can include any way in which the surface of the substrate or the depositing thin film can be modified (i.e. etching, oxidizing, nitriding, ion bombarding, etc.) Through selection of a noble or source gas, the technique could be used as either an ion source for ion assisted deposition processes (use of Ar, for example), as a substrate etching process (use of $NF_3$, for example) or as an independent thin film deposition method ( use of a $CH_4+H_2$ gas mixture, for example). Electromagnets can be used to separate neutral radicals leaving a clean ion beam or to separate different film producing species. Since the microwave plasma potential is relatively low, variation of the substrate bias will lead to control of the energy of the ions bombarding the growing film surface. Variation of the distanced between the plasma and the substrate can also alter the chemistry at the substrate and/or growing thin-film surface.

An example of the type of deposition possible with the instant system is the high speed deposition of high quality silicon material. In such a deposition $SiH_4$ and other gases such as $H_2$ and He are introduced into the chamber 1 through a gas jet injection port 3. The gases flow can range from 5–100 sccm for $SiH_4$ (typically around 40 sccm), 0–2000 sccm for $H_2$ (typically around 2000 sccm), and 0–1500 sccm for He (typically 0 sccm). Other gases may be used such as Ar and gaseous sources of fluorine, such as Si—F or Si—F—H compound gases or atomic fluorine. The background pressure in the chamber is typically around 4–5 mT, with the pressure closer to the gas nozzle being much higher. The substrate may be heated and/or electrically biased. Typical substrate temperature is about 250° C.

The e-beam energy is typically around 15 KeV at a power level of about 1000–5000 W. The e-beam is focused on the rapidly expanding gases as they exit the gas injection jet. The microwave energy is typically supplied at a power of about 500–5000 W and typically has a frequency of about 2.45 GHz. Clearly other e-beam and microwave energies, powers and frequencies may be used and are considered within the scope of the instant invention.

The silicon material typically deposits on the substrate at a rate of anywhere from 5–200 Å/s, depending on gas flow rates and e-beam/microwave powers. Using exclusively $SiH_4$ and $H_2$, polycrystalline or microcrystalline Si materials are formed at deposition rates of about 20 Å/s or less, while amorphous silicon materials are formed at higher deposition rates. When the amorphous silicon materials are formed into a single junction solar cell, the cell typically has an efficiency of about 5.4%; a fill-factor of about 0.69; a short circuit current of about 8.5 mA/cm$^2$; and an open circuit voltage of about 0.92 V. Of course, these properties will vary depending on the parameters of the deposition.

There are several general characteristics which make this the instant gas jet plasma method ideal for either a separate ion beam source, a plasma etching method or a thin film deposition technique. These characteristics are listed herein below.

First, microwave plasmas are known to create large ion and neutral density fluxes. As mentioned above, the neutral radicals can be separated from the ions creating a clean high ion flux beam. In both ion source assisted application and thin film deposition, the ion flux can be controlled though variation of the gas flows and the electron beam and microwave excitation powers. In the case of thin film deposition, the ion flux/adatom ratio can be altered by varying the ratio of source gas flows (e.g. $CH_4$) to dilutant gas flow (e.g. $H_2$). The high fluxes and/or energies can be used to create an efficient plasma etching source.

Second, since potentials of microwave plasmas are relatively low, substrate biasing can be used to rigidly control the ion beam energies.

Third, with the use of the gas jet, one can obtain a variety of surface coverage areas through variation in the gas jet orifice size or the substrate to gas jet distance. Polisan et. al. in their studies of the electron beam excited gas jet, were able to deposit high quality a-Si material over a 70 sq. in. area with only a 5% variation in film thickness across the area. The thickness uniformity is even better with the addition of the microwave cavity.

Also, we have been able to obtain deposition rates as high as 200 Å/s with this configuration. In addition, the gas utilization for microwave plasmas is typically near 100%. Thus high deposition rates are obtained when the benefits of both high rate deposition processes are combined.

Additionally, there are many characteristics which make the instant process very desirable for deposition of thin film silicon materials. First, with proper system design, 100% utilization of the source gas ($SiH_4$) can be obtained through use of a microwave source. With this high dissociation rate for $SiH_4$ and large H fluxes, deposition rates as high as 24 Å/s have been obtained for polycrystalline and microcrystalline silicon films and for silicon materials in general, from 5–200 As. Preferably deposition rates for high quality amorphous materials are equal to or greater than 10 Å/s using the instant deposition technique.

Second, the high dissociation efficiency of a microwave plasma can also be used to prepare an atomic hydrogen rich region near the substrate surface by diluting the plasma with a large amount of $H_2$. It has been demonstrated numerous times that the presence of a large flux of atomic hydrogen near the growing film surface is a key element for the growth of high quality microcrystalline silicon. However, to obtain these large fluxes using conventional PECVD techniques, one must use deposition conditions which lead to which lead to growth rates of 1 Å/s or less. With the use supplies high gas flows in a concentrated region and the microwave plasma which at the same time creates a large amount of atomic hydrogen and silicon-based species, one can obtain both a large amount of depositing adatoms as well as a large flux of atomic hydrogen at the growing surface. This combination of features has allowed us to obtain microcrystalline growth at rates as high as 24 Å/s.

Figure 3:
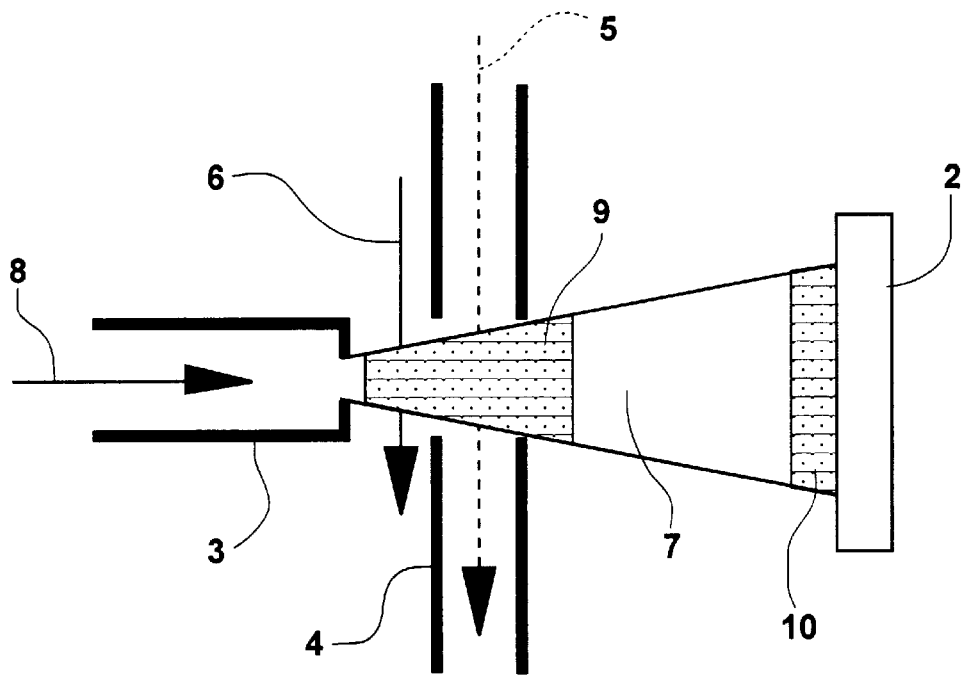
FIG. 3 is yet another stylized drawing of the apparatus of the instant invention specifically depicting the high pressure region located close to the gas jet and the low pressure region located adjacent to the substrate.

Third, by providing a large supply of gas in a concentrated region, use of the gas jet allows for the creation of a high gas density region at the nozzle hole while maintaining a low pressure region near the substrate. See FIG. 3, in which the high pressure region 9 is located close to the gas jet 3. The low pressure region is formed because of the low background pressure and the quick dispersal of the gas after leaving the vicinity of the gas jet. See FIG. 3, in which the low pressure region 10 is located adjacent the substrate. In this system design, the microwaves and the electron beam are focused at the high density region 9. Thus, with the fast gas speeds, species are formed in the high density region 9, but quickly move to the low pressure region 10, prior to reaching the substrate 2. This allows for little interaction time between the different species and a limited chance for gas phase polymerization to occur which is known to be detrimental for film growth.

Fourth, because of the ability to create a low pressure region at the substrate surface, high electron temperatures are obtainable at the substrate surface while still maintaining high deposition rates. This combination of high electron temperatures and high deposition rates are difficult to obtain using conventional methods which usually require high pressures to obtain high growth rates. However, several studies for amorphous silicon based materials have shown the benefits in having high electron temperatures at the growing surface for improved film growth.

Fifth, the ability to adjust the distance between the plasma and the substrate gives one the flexibility to control a few parameters which affect film growth. By varying this distance, one can vary the degree of ion bombardment which has been proven to be an important parameter in the growth of amorphous as well as other thin films. Heavy bombardment conditions can be obtained by placing the substrates close or in the plasma region or much of the ion bombardment of the growth surface can be eliminated by significantly separating the substrate from the plasma. One can also vary the electron temperature by altering the plasma-to-substrate distance with high electron temperatures obtained at large separations.

Figure 4:
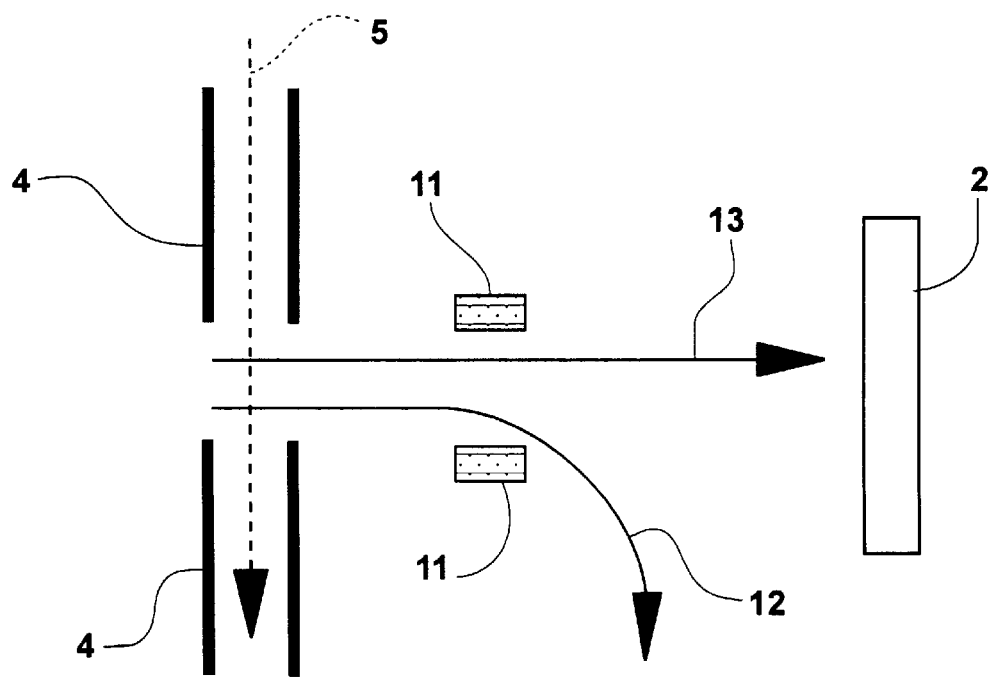
FIG. 4 depicts a final embodiment of the instant apparatus showing how magnets can be used to create a magnetic field between the high velocity plasma and the substrate.

Sixth, the unique geometry of this innovative deposition technique creates a highly directional flow of species from the plasma region to the substrate. With such a geometry, one can select the species which reach the substrate through the use of magnetic fields between the plasma and the substrate as is depicted in FIG. 4. With proper selection of the magnetic field, supplied by magnets 11, species which are beneficial to film growth 13 can be allowed to reach the substrate surface 2 while those that are detrimental to film growth 12 can be deflected away from the substrate 2. Use of this species selection technique can improve the quality of the resulting film.

Seventh, the ability to obtain large atomic hydrogen fluxes at the growing surface as well as high electron temperatures can create large adatom surface mobilities at the growing film surface. Thus, high substrate temperatures would not be required to prepare high quality microcrystalline silicon films. This ability to grow these materials at low substrate temperatures allows for the use of light weight plastics as substrate materials which is important for many industries, in particular for the flat panel display industry.

Finally, although many attempts have been made, microcrystalline silicon-carbon alloys have yet to be made using standard PECVD processes. Microwave and electron cyclotron resonance techniques have been used to prepare these types of alloys. Since the instant method utilizes microwaves for plasma generation, the silicon-carbon alloys can be made with this technique at high deposition rates. This will be important for our future efforts to widen the band gap of the microcrystalline material to improve the open circuit voltages of our solar cell devices.

In addition to having a single plasma in the system from which depositing species are created as well as from which ions for ion bombardment of the depositing surface are created, two plasmas may used. One of these plasmas would be used to create depositing species and the other would be used for modifying the conditions at the growing film surface through controlled ion bombardment and/or etching. For example depositing silicon species may be created in the first plasma and ions of argon, hydrogen, fluorine, or a mixture thereof may be created in the second plasma. The ions created in the second plasma may then be directed to the depositing surface to provide for ion bombardment thereof. This second plasma may be created using gases that flow at transonic or non-transonic velocities. The second plasma is shown in FIG. 2 as reference numeral 21. This second plasma 21 is formed via microwave energy 5 from the second source of microwave energy 20 which impinges on the second source of gas 8b.

Having this combination of characteristics makes this deposition technique unique from other methods with which the deposition rates for high quality microcrystalline films are limited to around 1 Å/s. Besides the higher deposition rates, improved material properties may also be obtained using this innovative film preparation method.

While the instant invention has been described in conjunction with deposition of hard coating and photovoltaic thin films, the instant invention is useful for depositing any type of thin film. It may also be used exclusively as a new surface etching method and apparatus. Therefore, the foregoing drawings, discussion and description are not meant to be limitations upon the practice of the present invention but illustrations thereof. It is the following claims, including all equivalents, which define the scope of the invention.

We claim:

1. A plasma jet surface modification or thin-film deposition apparatus, said apparatus including:
    an evacuable deposition chamber;
    a substrate disposed within said chamber;
    a source of transonic velocity feedstock gas;
    a source of e-beam energy;
    a source of microwave energy;
    said e-beam energy and microwave energy impinging upon said source of transonic velocity feedstock gas creating a high velocity plasma of activated species, said high velocity plasma forming a plume directed towards said substrate and said activated species modifying the surface of said substrate or depositing onto said substrate, depending on the feedstock gas employed.

2. The plasma jet deposition apparatus of claim 1, wherein said source of transonic velocity feedstock gas includes a gas delivery system and a gas jet nozzle, said gas jet nozzle positioned within said chamber.

3. The plasma jet deposition apparatus of claim 2, wherein said gas jet nozzle is rotatable, thereby allowing the direction of travel of the activated species within said high velocity plasma to be varied.

4. The plasma jet deposition apparatus of claim 1, wherein said substrate is a moving elongated web of substrate material which passes into and out of said evacuable deposition chamber.

5. The plasma jet deposition apparatus of claim 1, wherein said substrate is formed from stainless steel.

6. The plasma jet deposition apparatus of claim 1, wherein said substrate is formed from a polymer material.

7. The plasma jet deposition apparatus of claim 1, wherein said substrate is a heated substrate.

8. The plasma jet deposition apparatus of claim 1, wherein said substrate is an electrically biased substrate.

9. The plasma jet deposition apparatus of claim 1, wherein said feedstock gas comprises a source of feedstock gas which provides depositing species within said plasma and optionally a source of feedstock gas which provides non-depositing species within said plasma.

10. The plasma jet deposition apparatus of claim 9, wherein said feedstock gas which provides depositing species within said plasma is a source of feedstock gas which is reactive with other species within said gas.

11. The plasma jet deposition apparatus of claim 1, wherein said source of e-beam energy comprises a 15 KeV source of e-beam energy.

12. The plasma jet deposition apparatus of claim 1, wherein said source of e-beam energy comprises a 1000–5000 W source of e-beam energy.

13. The plasma jet deposition apparatus of claim 1, wherein said source of microwave energy comprises a 2.45 GHz source of microwave energy.

14. The plasma jet deposition apparatus of claim 1, wherein said source of microwave energy comprises a 500–5000 W source of microwave energy.

15. The plasma jet deposition apparatus of claim 1, wherein said apparatus further includes a second source of gas.

16. The plasma jet deposition apparatus of claim 15, wherein said second source of gas comprises a source of non-transonic gas.

17. The plasma jet deposition apparatus of claim 15, wherein said second source of gas is introduced into said evacuable chamber adjacent said plasma created by said source of transonic velocity feedstock gas.

18. The plasma jet deposition apparatus of claim 15, wherein said apparatus further includes a second source of microwave energy.

19. The plasma jet deposition apparatus of claim 18, wherein the gas from said second source of gas is impinged upon by the microwaves from said second source of microwaves, creating a second plasma.

20. The plasma jet deposition apparatus of claim 1, wherein said apparatus further includes a magnetic field between said high velocity plasma and said substrate.

21. A plasma jet etching or thin-film deposition method comprising the steps of:
    providing an evacuable deposition chamber;
    disposing a substrate in said deposition chamber;
    introducing feedstock gas into said deposition chamber at transonic velocity;
    impinging e-beam energy onto said feedstock gas;
    impinging microwave energy onto said feedstock gas;
    said e-beam and microwave energy creating a high velocity plasma plume of activated species;
    directing said plume toward said substrate;
    said activated species modifying the surface of said substrate or depositing onto said substrate, depending on the feedstock gas employed.

* * * * *

UNITED STATES PATENT AND TRADEMARK OFFICE
CERTIFICATE OF CORRECTION

PATENT NO.     : 6,028,393
DATED          : February 22, 2000
INVENTOR(S)    : Masatsugu Izu, Joachim Doehler and Scott Jones It is certified that error appears in the above-identified patent and that said Letters Patent is hereby corrected as shown below:

Column 1,
Line 6, insert
-- This invention was made with Government support under Contract No. DE-FG02-96ER82162 awarded by the Department of Energy. The government has certain rights in this invention. --

Signed and Sealed this

Eighteenth Day of February, 2003

JAMES E. ROGAN
*Director of the United States Patent and Trademark Office*